United States Patent
Ling et al.

(10) Patent No.: US 8,640,012 B2
(45) Date of Patent: Jan. 28, 2014

(54) COMMUNICATION SIGNAL DECODING WITH ITERATIVE COOPERATION BETWEEN INNER AND OUTER CODES

(75) Inventors: Fuyun Ling, San Diego, CA (US); Thomas Sun, San Diego, CA (US); Tao Tian, San Diego, CA (US); Raghuraman Krishnamoorthi, San Diego, CA (US); Jing Jiang, San Diego, CA (US)

(73) Assignee: QUALCOMM Incorporated, San Diego, CA (US)

( * ) Notice: Subject to any disclaimer, the term of this patent is extended or adjusted under 35 U.S.C. 154(b) by 816 days.

(21) Appl. No.: 12/430,719

(22) Filed: Apr. 27, 2009

(65) Prior Publication Data

US 2009/0271688 A1 Oct. 29, 2009

Related U.S. Application Data

(60) Provisional application No. 61/048,483, filed on Apr. 28, 2008.

(51) Int. Cl.
*G06F 11/00* (2006.01)

(52) U.S. Cl.
USPC .......................... 714/784; 714/791

(58) Field of Classification Search
USPC ................... 714/784, 785–788, 791
See application file for complete search history.

(56) References Cited

U.S. PATENT DOCUMENTS

| | | | |
|---|---|---|---|
| 5,721,746 A * | 2/1998 | Hladik et al. | 714/792 |
| 6,298,461 B1 | 10/2001 | Tong et al. | |
| 7,134,065 B2 * | 11/2006 | McIntire et al. | 714/762 |
| 7,519,898 B2 | 4/2009 | Narayanan et al. | |
| 2004/0132416 A1 * | 7/2004 | Yee | 455/82 |
| 2004/0161059 A1 * | 8/2004 | Andrieu | 375/341 |
| 2004/0193996 A1 * | 9/2004 | Jaffe et al. | 714/755 |
| 2005/0229091 A1 * | 10/2005 | Narayanan et al. | 714/801 |
| 2009/0271686 A1 | 10/2009 | Jiang et al. | |

FOREIGN PATENT DOCUMENTS

WO 2007068554 6/2007

OTHER PUBLICATIONS

International Search Report, PCT/US2009/041946, International Searching Authority, European Patent Office, Nov. 2, 2009.
Wiltten Opinion, PCT/US2009/041946, International Searching Authority, European Patent Office, Nov. 2, 2009.
Nakajima S. et al "Trellis-coded 8-PSK scheme combined with turbo and single-parity-check product codes" Proc., IEEE Vehicular Technology Conference, VTC-Fall 2002, Vancouver, Canada, vol. 3, Sep. 24, 2002, Sep. 29, 2002 pp. 1782-1786, XP010608736, p. 1782-p. 1784.
Ming Jiang et al: "Reliability-based iterative decoding of LDPC Codes using likelihood accumulation" IEEE Communications Letters, IEEE Service Center, Piscataway, NJ, US, vol. 11, No. 8, Aug. 1, 2007, pp. 677-379, XP011190225, Issn: 1089-7798 the whole document.
Cathy Ye Liu et al: "An Interactive Concatenated Turbo Coding System" IEEE Transactions on Vehicular Technology, IEEE Service Center, Piscataway, NJ, US, vol. 51, No. 5, Sep. 1, 2002, XP011080709, Issn: 0018-9545 abstract.

(Continued)

*Primary Examiner* — Dieu-Minh Le
(74) *Attorney, Agent, or Firm* — Fulbright & Jaworski LLP

(57) ABSTRACT

Received communication signals may be decoded according to a combined, iterative inner code—outer code decoding technique. The inner code decoding is based on information produced by the outer code decoding.

60 Claims, 9 Drawing Sheets

(56) References Cited

OTHER PUBLICATIONS

Jiand J. et al: "Interative Soft-Input Soft-Output Decoding of Reed-Solomon Codes by Adapting the Parity-Check Matrix" IEEE Transactions on Information Theory IEEE USA, vol. 52, No. 8, Aug. 2006, pp. 3746-3756, XP002551398. Issn: 0018-9448 cited in the application.

Hagenauer, Joachim et al: "Iterative Decoding of Binary Block and Convolutional Codes", IEEE Transactions on Information Theory, USA, vol. 42, No. 2, Mar. 1, 1996, pp. 429-445, XP011026493.

Taiwan Search Report—TW098114064—TIPO—Jun. 8, 2013.

* cited by examiner

COMMUNICATION SIGNAL DECODING WITH ITERATIVE COOPERATION BETWEEN INNER AND OUTER CODES

RELATED APPLICATIONS

This application claims the benefit of priority from U.S. provisional patent Application Ser. No. 61/048,483, filed Apr. 28, 2008 and entitled "Communication Signal Decoding With Iterative Cooperation Between Turbo And Reed-Solomon Decoding," and application Ser. No. 12/165,659, filed Jul. 1, 2008, converted to provisional application Ser. No. 61/274,127 and entitled "Communication Signal Decoding With Iterative Cooperation Between Turbo And Reed-Solomon Decoding," both of which are fully incorporated herein by reference for all purposes.

BACKGROUND

1. Field

The present disclosure relates generally to communications and, more particularly, to coding/decoding schemes for use in communications.

2. Background

The documents listed below are incorporated herein by reference:

[1] S. Lin and D. J. Costello, "Error Control Coding: Fundamentals and Applications", 1st ed. Prentice Hall, 1983.

[2] G. D. Forney, "Generalized minimum distance decoding," IEEE Trans. Information Theory, vol. 12, pp. 125-131, April 1996.

[3] D. Chase, "Class of algorithms for decoding block codes with channel measurement information," IEEE Trans. Information Theory, vol. 18, pp. 170-182, January 1972.

[4] M. P. C. Fossorier and S. Lin, "Soft-decision decoding of linear block codes based on ordered statistics," IEEE Trans. Information Theory, vol. 41, pp. 1379-1396, September 1995.

[5] R. Koetter and A. Vardy, "Algebraic soft-decision decoding of Reed-Solomon codes," IEEE Transactions on Information Theory, vol. 49, pp. 2809-2825, November 2003.

[6] A. Vardy and Y. Be'ery, "Bit-level soft-decision decoding of Reed-Solomon codes," IEEE Trans. Communications, vol. 39, pp. 440-444, March 1991.

[7] J. Jiang and K. R. Narayanan, "Iterative soft-input-soft-output decoding of Reed-Solomon codes by adapting the parity check matrix," IEEE Trans. Information Theory, vol. 52, no. 8, pp. 3746-3756, August 2006.

[8] J. Jiang, "Advanced Channel Coding Techniques Using Bit-level Soft Information," Ph.D dissertation, Dept. of ECE, Texas A&M University.

[9] Jason Bellorado, Aleksandar Kavcic, Li Ping, "Soft-Input, Iterative, Reed-Solomon Decoding using Redundant Parity-Check Equations", Invited paper, IEEE Inform. Theory Workshop (ITW), Lake Tahoe, Calif., USA, Sep. 2-6, 2007

[10] T. J. Richardson, A. Shokrollahi, and R. Urbanke, "Design of capacity-approaching low-density parity-check codes," IEEE Trans. Inform. Theory, vol. 47, pp. 619-637, Feb. 2001.

[11] D. J. C. MacKay, "Good error-correcting codes based on very sparse matrices," IEEE Trans. Inform. Theory, vol. 45, pp. 399-431, March 1999.

[12] R. G. Gallager, Low-Density Parity-Check Codes. Cambridge, Mass.: MIT Press, 1963.

[13] M. R. Chari, F. Ling, A. Mantravadi, R. Krishnamoorthi, R. Vijayan, G. K. Walker, and R. Chandhok, "FLO physical layer: An Overview," IEEE Trans. Broadcast., vol. 53, no. 1, pt. 2, pp. 145-160, March 2007.

FIG. 1 diagrammatically illustrates a prior art coding/decoding scheme for use in a communication system. The arrangement of FIG. 1 uses a concatenated coding structure with turbo coding for an inner code and Reed-Solomon (RS) coding for an outer code. At the transmitter, designated generally at 11, K data source packets are input to an outer RS encoder block 12. The RS encoder 12 takes the block of K input packets and encodes parities to create additional (N-K) parity packets. All the packets output by the RS encoder 12 are byte-level interleaved at 13, and then encoded through an inner turbo encoder 14. All the turbo encoded packets produced by the turbo encoder 14 are bit-level interleaved and modulated (not explicitly shown), and then transmitted through a noisy communication channel shown diagrammatically at 15. The receiver, designated generally at 16, implements the appropriate demodulation and bit-level de-interleaving (not explicitly shown), and includes a turbo decoder 17 that generates log likelihood ratios (LLRs) that respectively correspond to the turbo coded bits that arrive at the turbo decoder 17. The turbo decoder 17 updates the LLR values iteratively until the cyclic redundancy check (CRC) is satisfied or the maximum number of iterations is reached. Hard decisions regarding the bits of successfully decoded packets are de-interleaved at 18. An RS erasure decoder 19 performs erasure decoding to recover the erased packets if possible. All decoded packets are then passed from the RS decoder 19 to an upper layer at 10. The aforementioned documents designated as [1], [13] (and references therein) provide descriptions of the type of coding/decoding scheme shown in FIG. 1.

If (N, K) is the dimension of the RS code being used at the symbol-level (in bytes), then the RS code rate is $R_{RS}=K/N$. Some prior art systems support multiple code rates so, for example, K=8, 12, 14, or 16 can be used.

The encoding operation of an (N, K) RS code in the aforementioned concatenated coding system (12 in FIG. 1) is illustrated in FIG. 2. Each row in the data block 21 of FIG. 2 represents is a physical layer packet, and each column contains one byte from each of the packets. The first K packets from the top are the systematic packets from the source (see also FIG. 1). The RS encoder acts along each column of data, i.e. it looks at the K systematic bytes in a column and adds (N-K) parity bytes per column. Thus, for an (N, K) code, there would be N physical layer packets at the output of the RS encoder 12 of FIG. 1. The column-wise operation of the RS encoder 12 constitutes an implicit byte interleaving.

Referring again to FIG. 1, at the RS decoder 19, the turbo-decoded physical layer packets belonging to one interleaver block (e.g., the block 21 of FIG. 2) are first stored in a buffer. The CRC of each of the physical layer packets in the buffer is computed to determine whether the packet has been received correctly or not. If the CRC indicates an error, the entire packet is treated as an erasure. Each column of the block is an RS codeword. On the other hand, each row is a single physical layer packet, which is either received correctly or is declared to be an erasure. Thus, each RS codeword in the same RS block contains the same number of erasures in exactly the same positions. This structure can be used to further simplify the erasure decoding algorithm by using a single "generator matrix" to compute the erased locations from K non-erased ones for all the RS codewords. An (N, K) RS code has a redundancy of (N-K) bytes, and is therefore able to correct any combination of (N-K) or fewer erasures within a codeword. However, if more than (N-K) packets in the block are erased, there is no attempt to recover the erased packets in erasure decoding.

It is desirable in view of the foregoing to provide for decoding that is capable of recovering erasures that are lost by the prior art approach.

SUMMARY

Received communication signals may be decoded according to a combined, iterative inner code—outer code decoding technique. The inner code decoding is based on information produced by the outer code decoding.

BRIEF DESCRIPTION OF THE DRAWINGS

Various aspects of a wireless communications system are illustrated by way of example, and not by way of limitation, in the accompanying drawings, wherein.

DETAILED DESCRIPTION

The detailed description set forth below in connection with the appended drawings is intended as a description of various embodiments of the invention and is not intended to represent the only embodiments in which the invention may be practiced. For example, even though the preferred embodiment is described in the context of using a Turbo code as the inner code and Reed-Solomon code as the outer code, it should be apparent to those skilled in the part that the inner code could be a convolutional code or a block code and the outer code can also be a general block code (such as RS, BCH, Hamming code and etc.)

The detailed description includes specific details for the purpose of providing a thorough understanding of the invention. However, it will be apparent to those skilled in the art that the invention may be practiced without these specific details. In some instances, well known structures and components are shown in block diagram form in order to avoid obscuring the concepts of the invention.

The word "exemplary" is used herein to mean "serving as an example, instance, or illustration." Any embodiment described herein as "exemplary" is not necessarily to be construed as preferred or advantageous over other embodiments.

Figure 1:
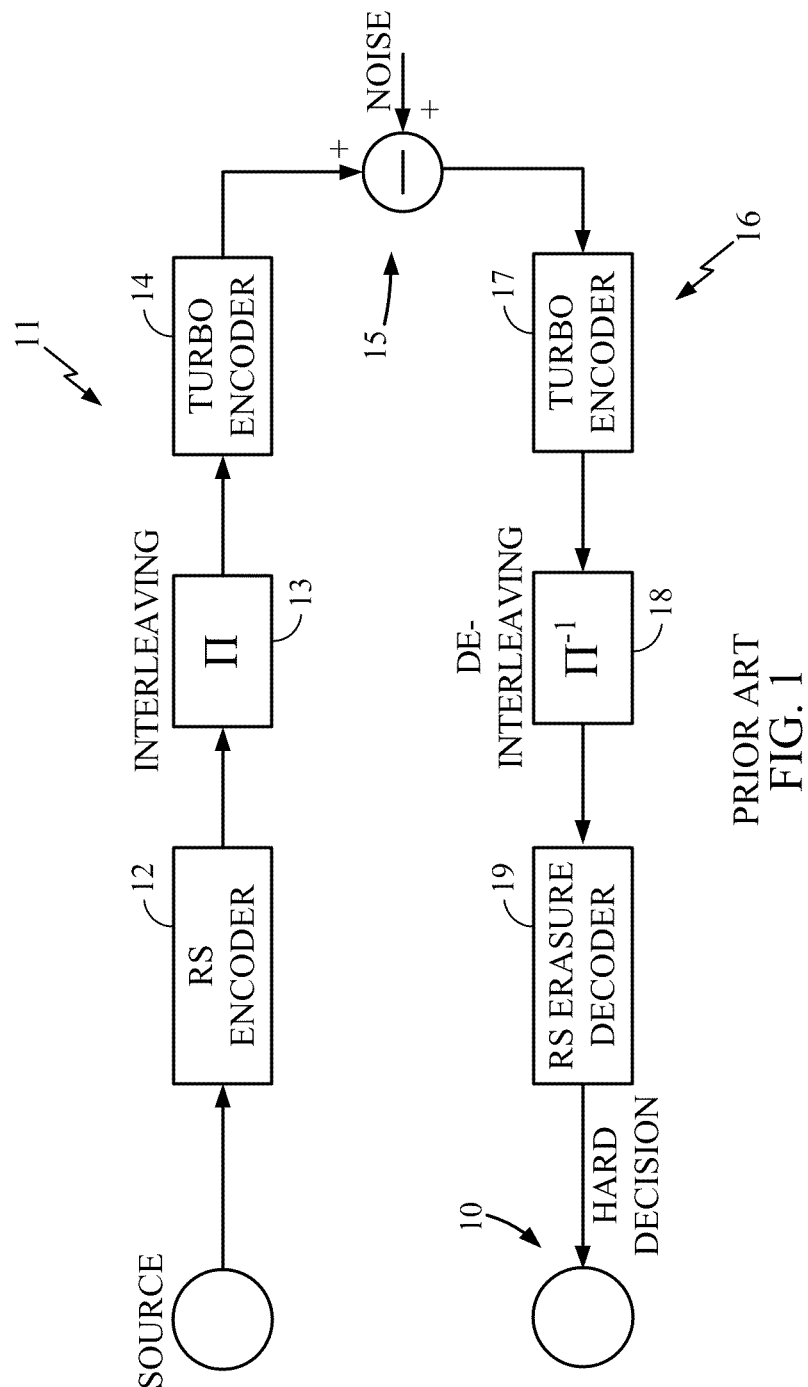
FIG. 1 diagrammatically illustrates a prior art coding/decoding scheme for use in a communication system.
Figure 2:
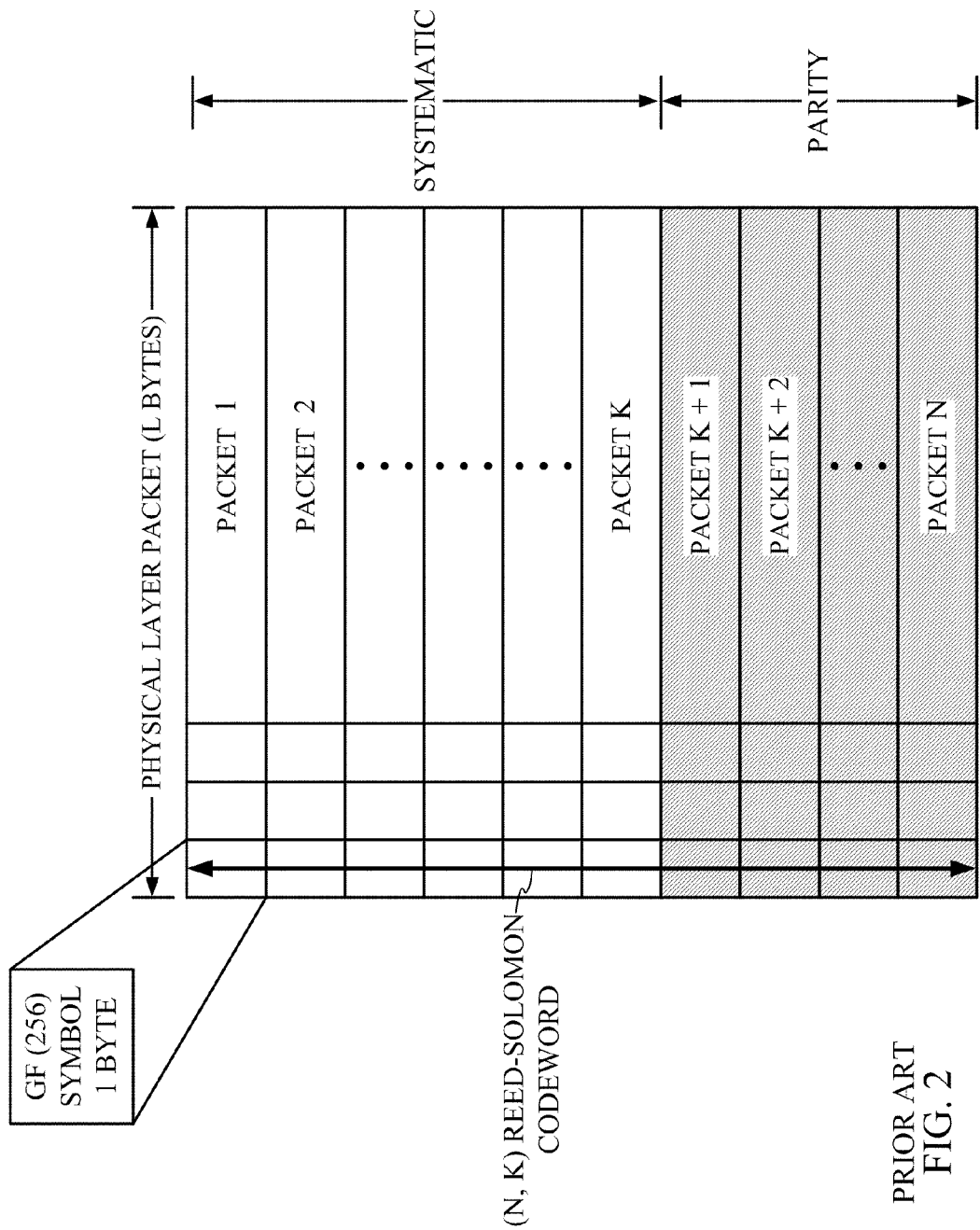
FIG. 2 illustrates the operation of an (N, K) Reed-Solomon code.

The present work recognizes that the prior art concatenated turbo-RS coding structure (such as shown in FIG. 1) does not fully exploit the potential error correction capability of the overall turbo-RS code. In this prior art approach, whenever the turbo decoder fails to converge to satisfy the CRC, the relevant soft information available to the RS decoder is discarded. Exemplary embodiments of the present work provide improved decoding performance by implementing iterative decoding between a turbo decoder and an RS decoder. Soft decision decoding of the RS code is used to support the iterative decoding between the turbo and RS decoders. This soft decision decoding utilizes the soft information available to the RS decoder.

RS codes can be viewed as non-binary Bose-Chaudhuri and Hocquenghem (BCH) codes. Consider an RS (N, K) code over GF(q) with a minimum distance $d_{min}=N-K+1$, its parity check matrix can be represented as:

$$H_s = \begin{pmatrix} 1 & \alpha^b & \ldots & \alpha^{(N-1)b} \\ 1 & \alpha^{b+1} & \ldots & \alpha^{(N-1)(b+1)} \\ 1 & & \ddots & \\ 1 & \alpha^{b+N-k} & \ldots & \alpha^{(N-1)(b+N-K)} \end{pmatrix}$$

where $\alpha$ is a primitive element in GF(q) and b is an integer number.

It is known that all the $2^m$ elements in $GF(2^m)$, namely, 0, 1, $\alpha, \alpha^2, \ldots, \alpha^{2^m-2}$, can be represented by an m-dimensional binary vector expansion in GF(2) using a basis which spans $GF(2^m)$. Addition operation in $GF(2^m)$ is simply the component wise addition of the vectors over GF(2). Similarly, multiplication can be achieved by matrix multiplication. Each entry in the parity check matrix $H_s$ can be represented in the binary form using an m×m matrix over GF(2). For instance, for RS codes over GF(4), where $\alpha$ is a root of the primitive polynomial $p(x)=x^2+x+1$, $\alpha$ has the binary vector representation [0, 1]. The multiplication operation ×$\alpha$ corresponds the binary multiplication of the vector expansion with a multiplication matrix $$\times \begin{pmatrix} 0 & 1 \\ 1 & 1 \end{pmatrix}.$$

In other words, an RS code can also be viewed as a binary linear block code. Therefore, RS codes over $GF(2^m)$, which are used in many communication systems, such as the current FLO system, can be represented using equivalent binary image expansions. Let n=N×m and k=K×m be the length of the codeword and the message at the bit-level, respectively. $H_s$ has an equivalent binary image expansion $H_b$, where $H_b$ is an (n-k)×n binary parity check matrix. For example, a shortened (16, 12) RS code has an equivalent binary image form, which is a binary (128, 96) code.

Due to the binary image form of RS codes over $GF(2^m)$, and further because the soft information available to the RS decoder is in the form of an LLR of each bit, many decoding algorithms proposed for binary codes become directly applicable to RS codes over $GF(2^m)$. Bit-level soft decision decoding algorithms have been found to be efficient in decoding RS codes over $GF(2^m)$.

Figure 3:
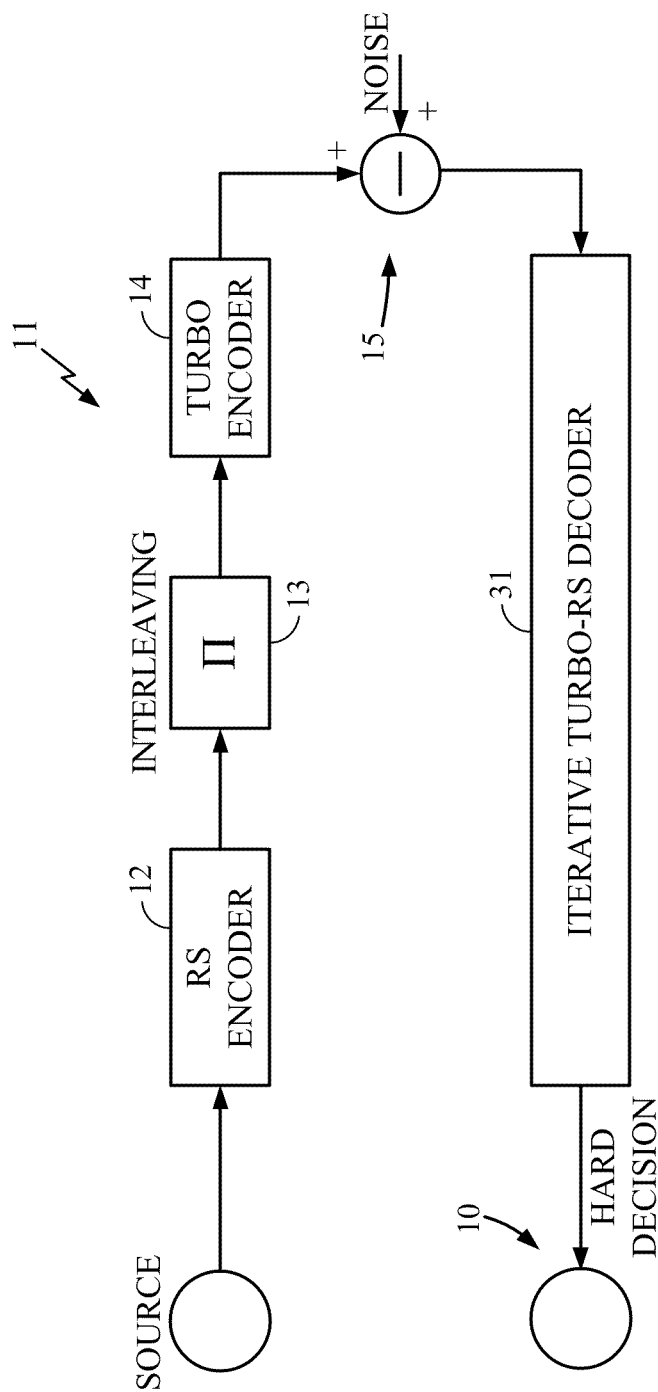
FIG. 3 diagrammatically illustrates exemplary embodiments of coding/decoding schemes for use in a communication system according to the present work.

FIG. 3 diagrammatically illustrates a coding/decoding scheme for use in a communication system (e.g., a wireless communication system) according to exemplary embodiments of the present work. Some embodiments use the prior art transmitter shown generally at 11 in FIG. 1. The receiver, designated generally at 36, includes an iterative turbo-RS decoder 31 that receives turbo coded bits in the same manner as received by the turbo decoder 17 of FIG. 1. The iterative turbo-RS decoder applies iterative turbo-RS decoding to the received turbo coded bits in order to produce hard decisions that are passed to the upper layer 10 (see also FIG. 1). The structure and operation of the iterative turbo-RS decoder 31 can be understood in the context of the known structure and operation of the prior art decoding arrangement of FIG. 1.

Figure 4:
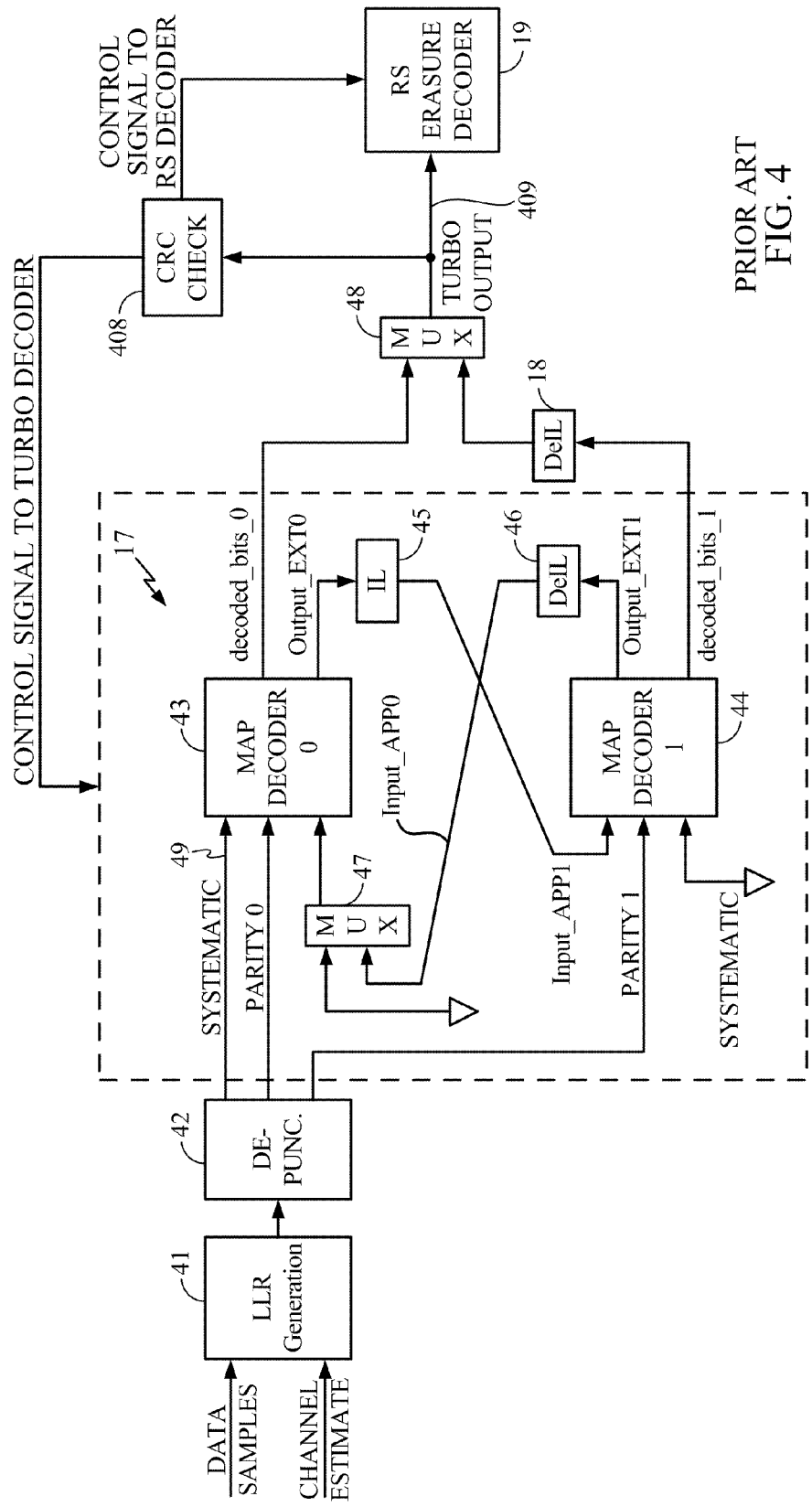
FIG. 4 diagrammatically illustrates a portion of prior art FIG. 1.

FIG. 4 diagrammatically illustrates the components 17-19 of FIG. 1 in more detail. The turbo decoder 17 includes an LLR generator 41, a de-puncturing unit 42, maximum a posteriori (MAP) probability decoders 43 and 44, interleaver 45, de-interleaver 46, and multiplexer 47, arranged and interconnected in conventional fashion as shown. The de-interleaver 18 (see also FIG. 1) de-interleaves the decoded bits from MAP decoder 44, and feeds them to one input of a multiplexer 48 (not explicitly shown in FIG. 1) whose other input receives the decoded bits from the MAP decoder 43. The turbo decoder 17 receives data samples and channel estimate information, and employs conventional turbo decoding (utilizing the signals labeled as systematic, parity 0, parity 1, Input_APP0, Input_App1, Output_EXT0, and Output_EXT1) to produce the conventional turbo output at 409. This turbo output 409 is provided to the RS erasure decoder 19. Turbo output is also sent to the CRC check block (408) for error detection and a control signal is generated in the CRC check block (408) for both the turbo decoder and the RS erasure decoder.

Figures 5, 11, 12:
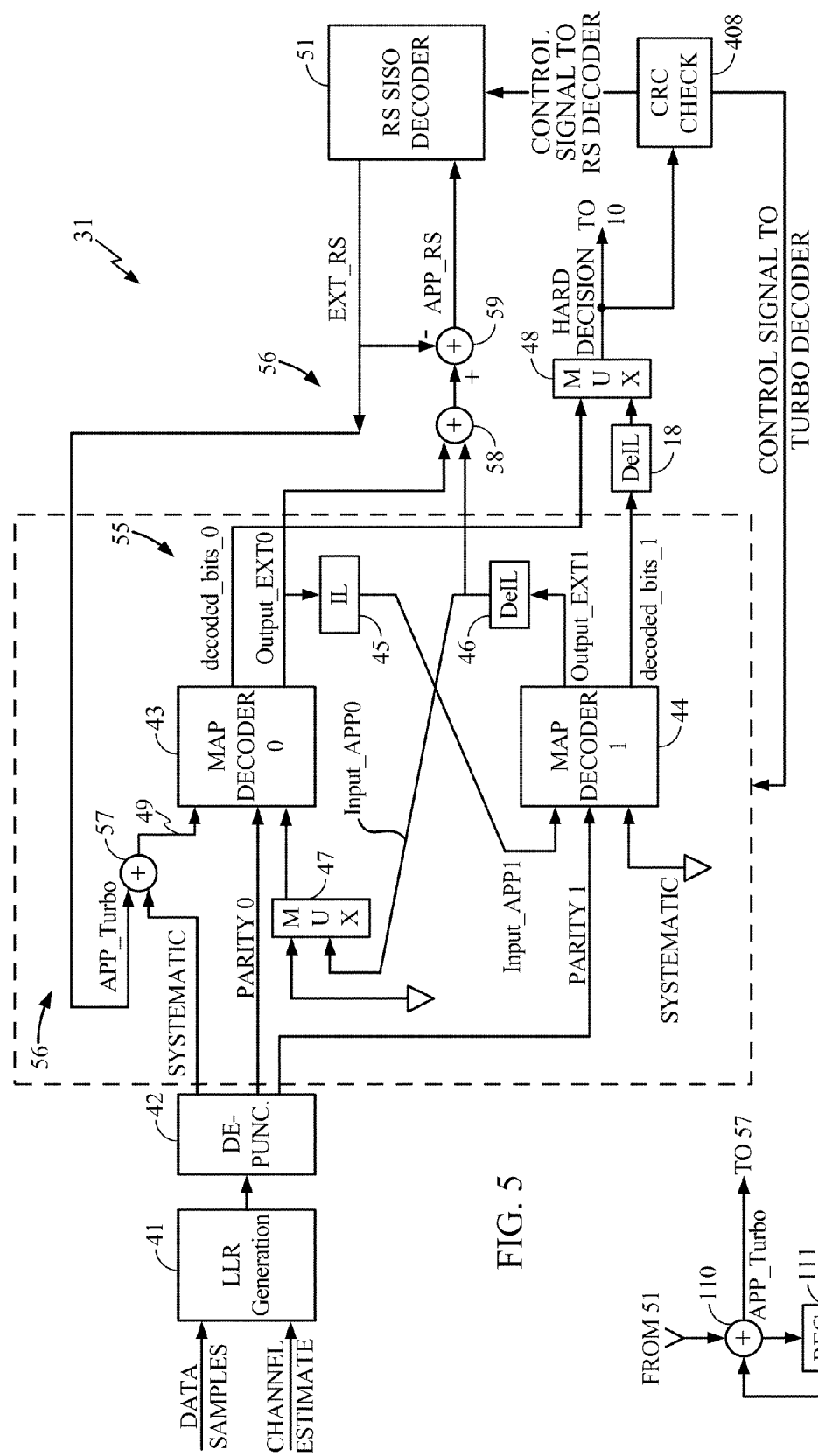
FIG. 5 diagrammatically illustrates a portion of FIG. 3 according to exemplary embodiments of the present work.
FIG. 11, when considered together with FIG. 5, diagrammatically illustrates a portion of FIG. 3 according to exemplary embodiments of the present work.
FIG. 12, when considered together with FIG. 5, diagrammatically illustrates a portion of FIG. 3 according to exemplary embodiments of the present work.

FIG. 5 diagrammatically illustrates the iterative turbo-RS decoder 31 (see also FIG. 3) according to exemplary embodiments of the present work. The iterative turbo-RS decoder 31 differs from the conventional decoding arrangement of FIG. 4 in that a RS SISO (soft input-soft output) decoder 51 and a modified turbo decoder 55 are combined for iterative decoding operations via a linking structure 56. RS SISO decoders such as shown at 51 are known in the art. In various embodiments, the RS SISO decoder 51 of FIG. 5 is implemented according to prior art techniques described in various ones of the documents incorporated by reference hereinabove (such as [2]-[9]).

The linking structure 56 of FIG. 5 includes a summing element 57 that receives extrinsic LLRs (designated as EXT_RS) produced by the RS SISO decoder 51. Instead of applying the systematic LLRs to the systematic input 49 of the MAP decoder 43 as in FIG. 4, the summing element 57 adds the systematic LLRs to the extrinsic LLRs EXT_RS, and applies the addition results to the systematic input 49 of the MAP decoder 43. The MAP decoders 43 and 44 perform the same iterative turbo decoding as in FIG. 4. As in FIG. 4, the extrinsic LLRs, Output_EXT0 and Output_EXT1, produced respectively by the MAP decoders 43 and 44, are used for iterative turbo decoding. However, these LLRs Output_EXT0 and Output_EXT1 are also applied to a summing element 58 of the linking structure 56. A further summing element 59 of the linking structure 56 subtracts the LLRs EXT_RS (generated from the previous RS SISO iteration) from the output results of the summing element 58. The subtraction results are provided to the RS SISO decoder 51 as a priori LLR inputs APP_RS. Every time the LLR's corresponding to a packet of Turbo coded bits are processed by MAP decoder 0 or MAP decoder 1, either the decoded bits 0 or the decoded bits 1 are feed to the multiplexor 48. Hard decisions of the output of 48 are checked by the CRC block 408. The hard decisions are provided to the upper layer 10 (see also FIG. 4) if the CRC is passed or the maximum number of iterations is reached. Otherwise, the Turbo-RS decoder continues to the next processing step.

Various embodiments employ various measures to improve performance. For example, when the CRC of a turbo packet is satisfied, all the bits in that packet may be considered to be correctly received and this information can be used to improve the decoding performance or simplify decoding (for example, the corresponding LLR's may be fixed to be a large value). Moreover, further turbo decoding on this packet may be skipped. The number of turbo iterations in turbo decoder 55, the number of RS iterations (in embodiments that use iterative RS decoding) in RS decoder 51, and the number of turbo-RS iterations between the turbo and RS decoders 55 and 51 may be adjusted to achieve desired performance and complexity tradeoffs.

Some embodiments exploit the bipartite graph structure of a linear block code. Recall that an RS code over GF ($2^m$) can be expanded using its binary image expansion and hence can be viewed as a binary linear block code. A binary parity check matrix is associated with any given RS code over GF ($2^m$). Therefore, iterative decoding techniques can be applied to the bipartite graph of a binary linear block code, e.g., an RS code.

Figure 6:
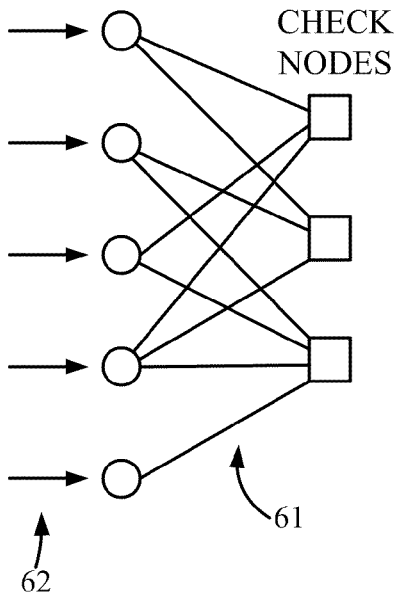
FIGS. 6-10 illustrate various prior art decoding techniques applicable to the bipartite graph structure of a linear block code.

The bipartite graph structure of a binary linear block code is known in the art as shown in FIG. 6. The circles on the left, variable nodes, are coded bits of the codeword, and the squares on the right, check nodes, are the single parity check constraints coded bits have to satisfy. Variable nodes and check nodes are connected via edges in the middle at 61. Iterative decoding is performed on the bipartite graph using the LLRs of coded bits as inputs 62. The bipartite graph structure of FIG. 6 supports conventional belief propagation (BP) based decoding, as described below.

Figure 7:
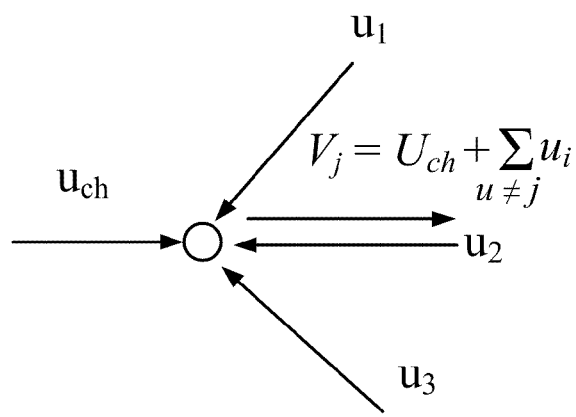

Conventional BP based decoding, as supported by the bipartite graph structure of FIG. 6, is composed of two steps, variable node update and check node update. As shown in FIG. 7, in the variable node update step, the updated variable-to-check node LLR $v_j$ associated with the jth edge is calculated as the summation of the channel LLR $v_{ch}$ and all check-to-variable node LLRs $u_i$ connected to that variable node except for the jth check-to-variable LLR $u_j$. Equation (1) below defines this calculation:

$$v_j = u_{ch} + \sum_{i \neq j} u_i \qquad (1)$$

Figure 8:
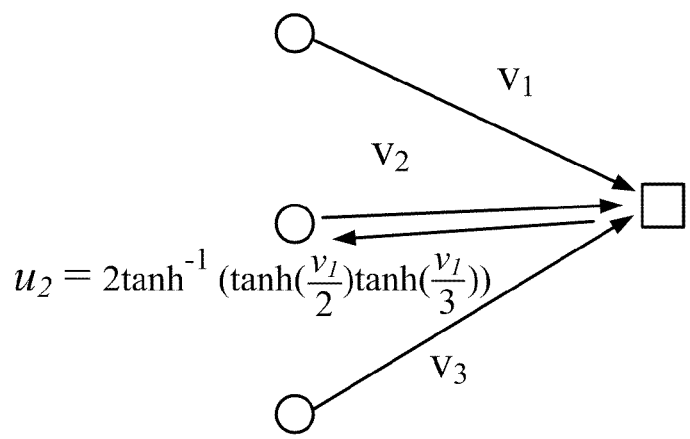

FIG. 8 graphically illustrates an example of the check node update step. The updated check-to-variable node LLR (e.g., $u_2$ in FIG. 8) is calculated according to equation (2) below:

$$u_j = 2\tanh^{-1}\left(\prod_{i \neq j} \tanh\left(\frac{v_i}{2}\right)\right) \qquad (2)$$

Figure 9:
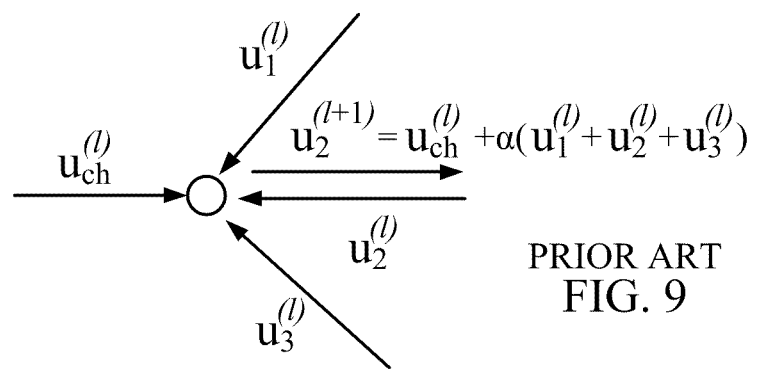
Figure 10:
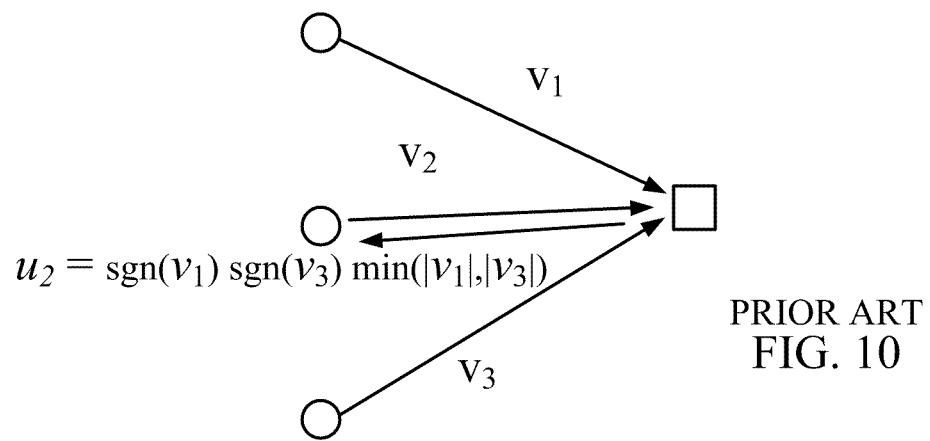

For a low complexity implementation, some embodiments modify the variable node update and the check node update as shown in the examples of FIGS. 9 and 10, respectively. The modified variable node update, referred to as a belief accumulation update, calculates the updated channel LLR at the lth RS SISO iteration, $u_{ch}^{(l+1)}$, according to equation (3) below:

$$u_j^{(l+1)} = u_{ch}^{(l+1)} = u_{ch}^{(l)} + \alpha \sum_i u_i^{(l)} \qquad (3)$$

where α is a scaling factor. The updated variable-to-check node LLR at the (l+1)th RS SISO iteration, $u_j^{(l+1)}$, is simply the updated channel LLR $u_{ch}^{(l+1)}$. FIG. 9 shows the use of equation (3) to compute the updated variable-to-check node LLR $u_2^{(l+1)}$. The modified check node update computes the updated check-to-variable node LLR according to the so-called min-sum algorithm, shown in equation (4) below:

$$u_j = \prod_{i \neq j} \text{sgn}(v_i) \min_{i \neq j}(|v_i|) \qquad (4)$$

FIG. 10 shows the use of equation (4) to compute the updated check-to-variable node LLR $u_2$. These reduced complexity approximations of the variable node and check node updates require less memory and facilitate hardware implementations.

In various embodiments, the RS SISO decoder 51 implements iterative decoding using various combinations of the decoding algorithms shown in equations (1)-(4) and FIGS. 7-10 to compute the variable and check node updates.

Referring again to FIG. 5, it will be noted that the linking structure 56 is configured to apply BP based updating rule to the RS-to-turbo update, because the summing element 57 functions according to BP based updating rule, and is configured to apply BP to the turbo-to-RS update because the summing element 59 functions as BP.

FIG. 11 diagrammatically illustrates embodiments that apply BA based updating rule to the RS-to-turbo update. In FIG. 11, instead of receiving EXT_RS directly from the RS SISO decoder 51 as in FIG. 5, the input APP_Turbo of summing element 57 receives the output of a summing element 110. The summing element 110 adds the current LLR EXT_RS to the sum of all the previous LLR EXT_RSes, which is stored in a register 111.

FIG. 12 diagrammatically illustrates embodiments that apply BA based updating rule to the turbo-to-RS update. In FIG. 12, instead of providing the subtraction result from summing element 59 to the APP_RS input of RS SISO decoder 51 as in FIG. 5, the output result of summing element 58 is applied directly to the APP_RS input.

Some embodiments use the BP based updating rule of FIG. 5 for the turbo-to-RS update, and use the BA based updating rule of FIG. 11 for the RS-to-turbo update. Some embodiments use the BP based updating rule of FIG. 5 for the RS-to-turbo update, and use the BA based updating rule of FIG. 12 for the turbo-to-RS update. Some embodiments use the BA based updating rule of FIG. 11 for the RS-to-turbo update, and use the BA based updating rule of FIG. 12 for the turbo-to-RS update.

Figure 14:
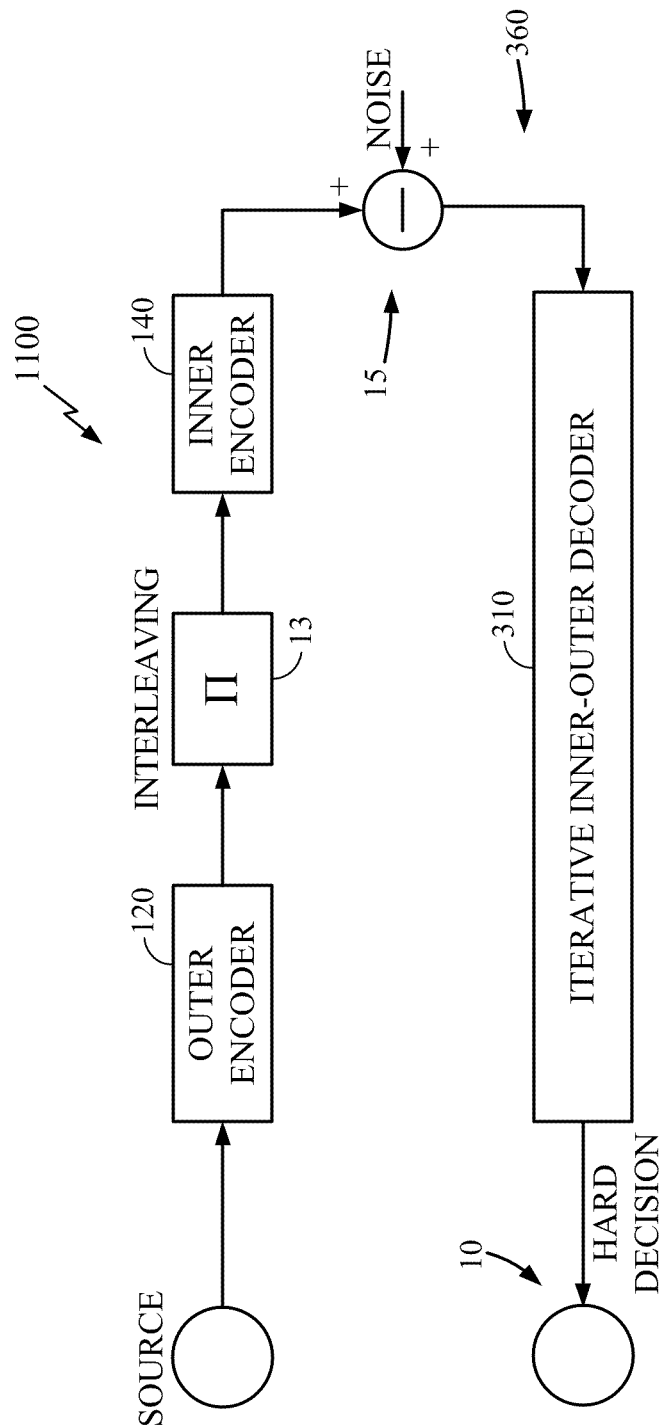
FIG. 14 diagrammatically illustrates exemplary embodiments of coding/decoding schemes for use in a communication system according to the present work.

Various embodiments use various inner codes in iteratively cooperating combination with various outer codes. In some embodiments, the inner code may be any code for which a suitably efficient soft input-soft output decoding algorithm is available. For example, the inner code may be a turbo code, a convolutional code, a low density parity check (LDPC) code, etc. In some embodiments, the outer code may be any general block code capable of being decoded using a soft input-soft output algorithm, for example, a Reed-Solomon code, a BCH code, a Hamming code, etc. Any desired combination of inner and outer codes may be used, as illustrated generally in FIG. 14. The transmit end 1100 includes an outer encoder 120, and an inner encoder 140, and the receive end 360 includes in iterative inner-outer decoder 310. As specific examples, combined iterative decoding of the type described above with respect to the turbo-RS combination may be performed for any of the inner-outer decoding combinations in the following (non-exhaustive) list: convolutional-RS; LDPC-RS; turbo-BCH; convolutional-BCH; LDPC-BCH; turbo-Hamming; convolutional-Hamming; and LDPC-Hamming.

Figure 13:
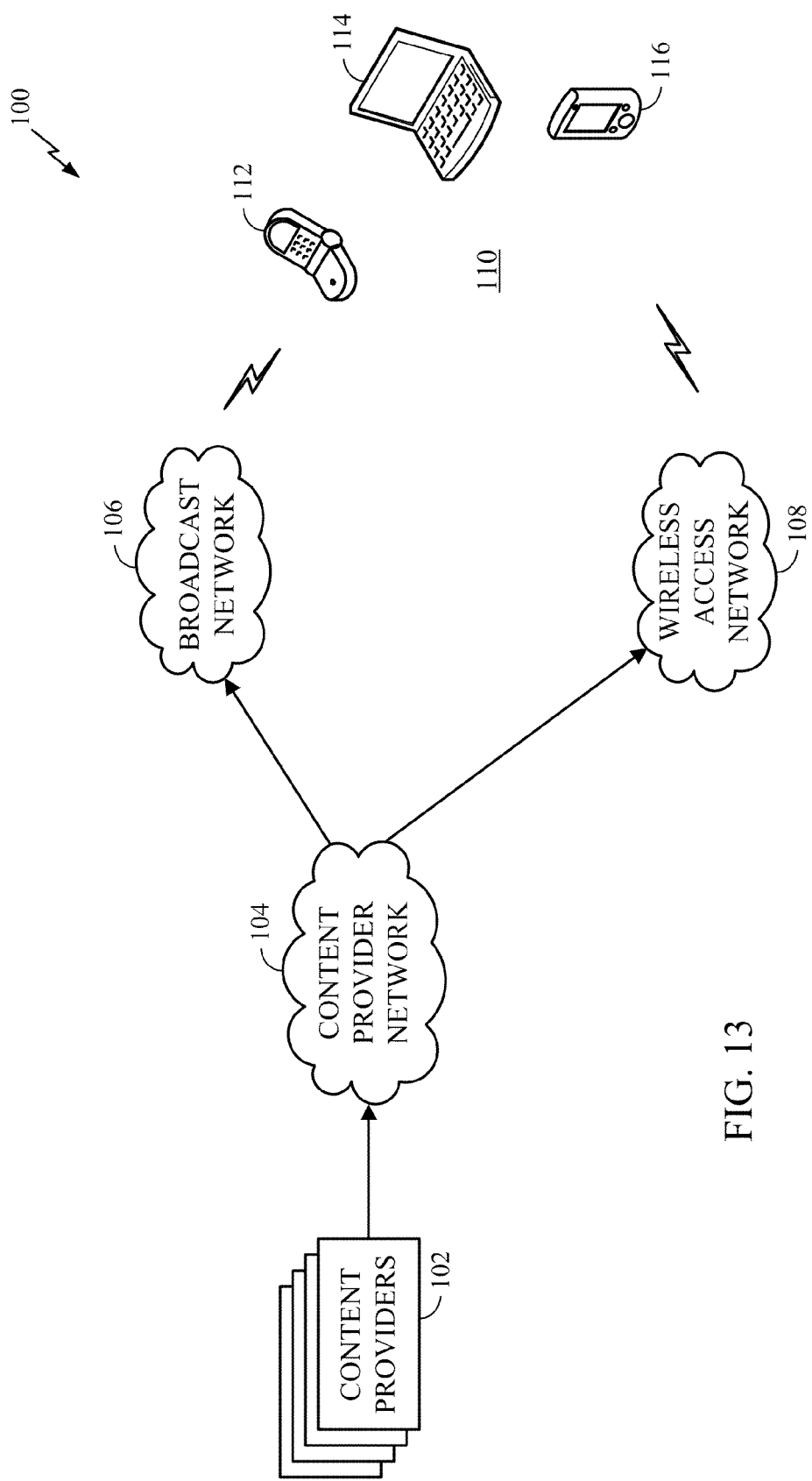
FIG. 13 diagrammatically illustrates exemplary embodiments of a communication system according to the present work.

FIG. 13 diagrammatically illustrates an example of a communications system 100 that may utilize the decoding techniques described above. The communications system 100 creates and broadcasts multimedia content across various networks to a large number of mobile subscribers. The communications system 100 includes any number of content providers 102, a content provider network 104, a broadcast network 106, and a wireless access network 108. The communications system 100 is also shown with a number of devices 110 used by mobile subscribers to receive multimedia content. According to various embodiments of the present work, these devices 110 may utilize therein the various ones of the decoding techniques described above. The devices 110 include a mobile telephone 112, a personal digital assistant (PDA) 114, and a laptop computer 116. The devices 110 illustrate just some of the devices that are suitable for use in the communications systems 100. It should be noted that although three devices are shown in FIG. 13, virtually any number of analogous devices or types of devices are suitable for use in the communications system 100, as would be apparent to those skilled in the art.

The content providers 102 provide content for distribution to mobile subscribers in the communications system 100. The content may include video, audio, multimedia content, clips, real-time and non real-time content, scripts, programs, data or any other type of suitable content. The content providers 102 provide content to the content provider network for wide-area or local-are distribution.

The content provider network 104 comprises any combination of wired and wireless networks that operate to distribute content for delivery to mobile subscribers. In the example illustrated in FIG. 13, the content provider network 104 distributes content through a broadcast network 106. The broadcast network 106 comprises any combination of wired and wireless proprietary networks that are designed to broadcast high quality content. These proprietary networks may be distributed throughout a large geographic region to provide seamless coverage to mobile devices. Typically, the geographic region will be divided into sectors with each sector providing access to wide-area and local-area content.

The content provider network 104 may also include a content server (not shown) for distribution of content through a wireless access network 108. The content server communicates with a base station controller (BSC) (not shown) in the wireless access network 108. The BSC may be used to manage and control any number of base transceiver station (BTS)s (not shown) depending on the geographic reach of the wireless access network 108. The BTSs provide access to wide-area and local-area for the various devices 110.

The multimedia content broadcast by the content providers 102 include one or more services. A service is an aggregation of one or more independent data components. Each independent data component of a service is called a flow. By way of example, a cable news service may include three flows: a video flow, an audio flow, and a control flow.

Services are carried over one or more logical channels. A logical channel may be divided into multiple logical sub-channels. These logical sub-channels are called streams.

Each flow is carried in a single stream. The content for a logical channel is transmitted through the various networks in a physical frame, sometimes referred to as a superframe.

The air interface used to transmit the physical frames to the various devices 110 shown in FIG. 13 may vary depending on the specific application and the overall design constraints. Some embodiments utilize Orthogonal Frequency Division Multiplexing (OFDM), which is also utilized by Digital Audio Broadcasting (DAB), Terrestrial Digital Video Broadcasting (DVB-T), and Terrestrial Integrated Services Digital Broadcasting (ISDB-T). OFDM is a multi-carrier modulation technique that effectively partitions the overall system bandwidth into multiple (N) sub-carriers. These sub-carriers, which are also referred to as tones, bins, frequency channels, etc., are spaced apart at precise frequencies to provide orthogonality. Content may be modulated onto the sub-carriers by adjusting each sub-carrier's phase, amplitude or both. Typically, quadrature phase shift keying (QPSK) or quadrature amplitude modulation (QAM) is used, but other modulation schemes may also be used.

As indicated above, the present work is applicable to communications applications that utilize wired communication links, as well as those that utilize wireless communication links. Some embodiments apply the present work to applications that provide access to data storage systems such as magnetic recording systems, memory systems, etc. In such applications, the communication channel 15 of FIGS. 3 and 14 includes the data storage system, the transmit end is a storage input access end, and the receive end is a storage retrieval access end.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the embodiments disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present invention.

The various illustrative logical blocks, modules, and circuits described in connection with the embodiments disclosed herein may be implemented or performed with a general purpose processor, a digital signal processor (DSP), an application specific integrated circuit (ASIC), a field programmable gate array (FPGA) or other programmable logic device, discrete gate or transistor logic, discrete hardware components, or any combination thereof designed to perform the functions described herein. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The steps of a method or algorithm described in connection with the embodiments disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal.

The previous description of the disclosed embodiments is provided to enable any person skilled in the art to make or use the present invention. Various modifications to these embodiments will be readily apparent to those skilled in the art, and the generic principles defined herein may be applied to other embodiments without departing from the spirit or scope of the invention. Thus, the present invention is not intended to be limited to the embodiments shown herein but is to be accorded the widest scope consistent with the principles and novel features disclosed herein.

What is claimed is:

1. An apparatus for processing data signals transmitted on a communication link, comprising:
    an input for receiving the data signals including systematic log likelihood ratios (LLRs);
    a turbo decoder coupled to said input and configured to perform turbo decoding;
    a Reed-Solomon (RS) decoder coupled to said turbo decoder and configured to perform RS decoding;
    wherein said turbo decoding is based on RS decoding information produced by said RS decoding;
    a first summing element for receiving first extrinsic LLRs from a first maximum of a first decoder in the turbo decoder and deinterleaved second extrinsic LLRs from a second decoder in the turbo decoder, wherein an input to the RS decoder includes a result obtained by subtracting an output of the RS decoder from an output of the first summing element; and
    a second summing element for receiving a first input and the systematic LLRs and providing an output to the first decoder, wherein the first input includes the output of the RS decoder.

2. The apparatus of claim 1, wherein said RS decoding information includes extrinsic information produced by said RS decoding.

3. The apparatus of claim 2, wherein said RS decoding is based on extrinsic information produced by said turbo decoding.

4. The apparatus of claim 1, wherein said RS decoding is based on extrinsic information produced by said turbo decoding.

5. The apparatus of claim 1, wherein said RS decoder is a soft input-soft output (SISO) decoder.

6. The apparatus of claim 1, including a belief propagation updating link coupled between said turbo decoder and said RS decoder, and configured to apply belief propagation to one of extrinsic information produced by said RS decoding and extrinsic information produced by said turbo decoding.

7. The apparatus of claim 6, including a further belief propagation updating link coupled between said turbo decoder and said RS decoder, and configured to apply belief propagation to the other of said extrinsic information produced by said RS decoding and said extrinsic information produced by said turbo decoding.

8. The apparatus of claim 1, including a belief accumulation updating link coupled between said turbo decoder and said RS decoder, and configured to apply belief accumulation to one of extrinsic information produced by said RS decoding and extrinsic information produced by said turbo decoding.

9. The apparatus of claim 8, including a belief propagation updating rule link between said turbo decoder and said RS decoder, and configured to apply belief propagation to the other of said extrinsic information produced by said RS decoding and said extrinsic information produced by said turbo decoding.

10. The apparatus of claim 1, wherein said RS decoding implements one of belief propagation decoding and belief accumulation decoding at the variable node for RS SISO decoding.

11. The apparatus of claim 1, wherein said RS decoding implements a min sum algorithm at the check node for RS SISO decoding.

12. The apparatus of claim 1, wherein the communication link is a wireless communication link.

13. A method of processing data signals transmitted on a communication link, comprising:
receiving the data signals including systematic log likelihood ratios (LLRs); and
performing turbo decoding on the data signals;
performing RS decoding, wherein said turbo decoding is based on RS decoding information produced by said RS decoding; and
summing first extrinsic LLRs from a first maximum a first decoding process in the turbo decoding and deinterleaved second extrinsic LLRs from a second decoding process in the turbo decoding to obtain a first summing result, and providing to the RS decoding a result obtained by subtracting an output of the RS decoding from the first summing result; and
summing a first input and the systematic LLRs to obtain a second summing result and providing the second summing result to the first decoding process, wherein the first input includes the output of the RS decoding.

14. The method of claim 13, wherein said RS decoding information includes extrinsic information produced by said RS decoding.

15. The method of claim 14, wherein said RS decoding is based on extrinsic information produced by said turbo decoding.

16. The method of claim 13, wherein said RS decoding is based on extrinsic information produced by said turbo decoding.

17. The method of claim 13, including applying belief propagation to one of extrinsic information produced by said RS decoding and extrinsic information produced by said turbo decoding, and using a result of said belief propagation to produce the other of said extrinsic information.

18. The method of claim 17, including applying further belief propagation to the other of said extrinsic information, and using a result of said further belief propagation to produce said one of said extrinsic information.

19. The method of claim 13, including applying belief accumulation to one of extrinsic information produced by said RS decoding and extrinsic information produced by said turbo decoding, and using a result of said belief accumulation to produce the other of said extrinsic information.

20. The method of claim 19, including applying belief propagation to the other of said extrinsic information, and using a result of said belief propagation decoding to produce said one of said extrinsic information.

21. The method of claim 13, wherein said RS decoding includes RS SISO decoding.

22. The method of claim 13, wherein said RS decoding implements one of belief propagation decoding and belief accumulation decoding at the variable node for RS SISO decoding.

23. The method of claim 13, wherein said RS decoding implements a min sum algorithm at the check node for RS SISO decoding.

24. The method of claim 13, wherein the communication link is a wireless communication link.

25. An apparatus for processing data signals transmitted on a communication link, comprising:
means for receiving the data signals including systematic log likelihood ratios (LLRs); and
means for performing turbo decoding on the data signals;
means for performing RS decoding, wherein said turbo decoding is based on RS decoding information produced by said RS decoding;
means for summing first extrinsic LLRs from a first maximum a first decoding process in the turbo decoding and deinterleaved second extrinsic LLRs from a second decoding process in the turbo decoding to obtain a first summing result, and providing to the RS decoding a result obtained by subtracting an output of the RS decoding from the first summing result; and
means for summing a first input and the systematic LLRs to obtain a second summing result and providing the second summing result to the first decoding process, wherein the first input includes the output of the RS decoding.

26. The apparatus of claim 25, wherein said RS decoding information includes extrinsic information produced by said means for performing RS decoding.

27. The apparatus of claim 26, wherein said RS decoding is based on extrinsic information produced by said means for performing turbo decoding.

28. The apparatus of claim 25, wherein said RS decoding is based on extrinsic information produced by said means for performing turbo decoding.

29. The apparatus of claim 25, wherein said means for performing RS decoding is a means for performing soft input-soft output (SISO) decoding.

30. The apparatus of claim 25, including a means for updating belief propagation coupled between said means for performing turbo decoding and said means for performing RS decoding, and configured to apply belief propagation to one of extrinsic information produced by said RS decoding and extrinsic information produced by said turbo decoding.

31. The apparatus of claim 30, including a further means for updating belief propagation coupled between said means for performing turbo decoding and said means for performing RS decoding, and configured to apply belief propagation to the other of said extrinsic information produced by said RS decoding and said extrinsic information produced by said turbo decoding.

32. The apparatus of claim 25, including a means for updating belief accumulation coupled between said means for performing turbo decoding and said means for performing RS decoding, and configured to apply belief accumulation to one of extrinsic information produced by said RS decoding and extrinsic information produced by said turbo decoding.

33. The apparatus of claim 32, including a further means for updating belief propagation between said means for performing turbo decoding and said means for performing RS decoding, and configured to apply belief propagation to the other of said extrinsic information produced by said RS decoding and said extrinsic information produced by said turbo decoding.

34. The apparatus of claim 25, wherein said means for performing RS decoding implements one of belief propagation decoding and belief accumulation decoding at the variable node for RS SISO decoding.

35. The apparatus of claim 25, wherein said means for performing RS decoding implements a min sum algorithm at the check node for RS SISO decoding.

36. The apparatus of claim 25, wherein the communication link is a wireless communication link.

37. A computer program product, comprising:
a non-transitory computer-readable medium comprising:
code for causing the at least one data processor to receive at least systematic log likelihood ratios (LLRs);
code for causing at least one data processor to perform turbo decoding;
code for causing the at least one data processor to perform RS decoding;
code for causing the at least one data processor to use said turbo decoding and said RS decoding in combination to decode data signals received via a communication link,
wherein said turbo decoding is based on RS decoding information produced by said RS decoding;
code for causing the at least one data processor to sum first extrinsic LLRs from a first maximum from a first decoding process in the turbo decoding and deinterleaved second extrinsic LLRs from a second decoding process in the turbo decoding to obtain a first summing result, and providing to the RS decoding a result obtained by subtracting an output of the RS decoding from the first summing result; and
code for causing the at least one data processor to sum a first input and the systematic LLRs to obtain a second summing result and providing the second summing result to the first decoding process, wherein the first input includes the output of the RS decoding.

38. The computer program product of claim 37, wherein said RS decoding information includes extrinsic information produced by said RS decoding.

39. The computer program product of claim 38, wherein said RS decoding is based on extrinsic information produced by said turbo decoding.

40. The computer program product of claim 37, wherein said RS decoding is based on extrinsic information produced by said turbo decoding.

41. The computer program product of claim 37, wherein said code for causing the at least one data processor to perform RS decoding is code for causing the at least one data processor to perform soft input-soft output (SISO) decoding.

42. The computer program product of claim 37, including code for causing the at least one data processor to apply belief propagation to one of extrinsic information produced by said RS decoding and extrinsic information produced by said turbo decoding.

43. The computer program product of claim 42, including code for causing the at least one data processor to apply belief propagation to the other of said extrinsic information produced by said RS decoding and said extrinsic information produced by said turbo decoding.

44. The computer program product of claim 37, including code for causing the at least one data processor to apply belief accumulation to one of extrinsic information produced by said RS decoding and extrinsic information produced by said turbo decoding.

45. The computer program product of claim 44, including code for causing the at least one data processor to apply belief propagation to the other of said extrinsic information produced by said RS decoding and said extrinsic information produced by said turbo decoding.

46. The computer program product of claim 37, wherein said RS decoding implements one of belief propagation decoding and belief accumulation decoding at the variable node for RS SISO decoding.

47. The computer program product of claim 37, wherein said RS decoding implements a min sum algorithm at the check node for RS SISO decoding.

48. The computer program product of claim 37, wherein the communication link is a wireless communication link.

49. An apparatus for processing data signals transmitted on a communication link, comprising:
an input for receiving the data signals including systematic log likelihood ratios (LLRs);
an inner decoder coupled to said input and configured to perform inner decoding;
an outer decoder coupled to said inner decoder and configured to perform outer decoding,
wherein said inner decoding is based on outer decoding information produced by said outer decoding;
a first summing element for receiving first extrinsic LLRs from a first maximum a first decoder in the turbo decoder and deinterleaved second extrinsic LLRs from a second decoder in the inner decoder, wherein an input to the outer decoder includes a result obtained by subtracting an output of the outer decoder from an output of the first summing element; and
a second summing element for receiving a first input and the systematic LLRs and providing an output to the first decoder, wherein the first input includes the output of the outer decoder.

50. The apparatus of claim 49, wherein said inner decoding includes one of convolutional decoding and LDPC decoding, and said outer decoding includes one of BCH decoding and Hamming decoding.

51. The apparatus of claim 49, wherein said communication link includes a data storage system.

52. A method of processing data signals transmitted on a communication link, comprising:
receiving the data signals including systematic log likelihood ratios (LLRs);
decoding the data signals, including performing inner decoding and performing outer decoding,
wherein said inner decoding is based on outer decoding information produced by said outer decoding;
summing first extrinsic LLRs from a first maximum a first decoding process in the inner decoding and deinterleaved second extrinsic LLRs from a second decoding process in the inner decoding to obtain a first summing result, and providing to the outer decoding a result obtained by subtracting an output of the outer decoding from the first summing result; and
summing a first input and the systematic LLRs to obtain a second summing result and providing the second summing result to the first decoding process, wherein the first input includes the output of the outer decoding.

53. The method of claim 52, wherein said inner decoding includes one of convolutional decoding and LDPC decoding, and said outer decoding includes one of BCH decoding and Hamming decoding.

54. The method of claim 52, wherein said communication link includes a data storage system.

55. An apparatus for processing data signals transmitted on a communication link, comprising:
  means for receiving the data signals including systematic log likelihood ratios (LLRs);
  means for decoding the data signals, including means for performing inner decoding and means for performing outer decoding,
  wherein said inner decoding is based on outer decoding information produced by said outer decoding;
  means for summing first extrinsic LLRs from a first maximum a first decoding process in the inner decoding and deinterleaved second extrinsic LLRs from a second decoding process in the inner decoding to obtain a first summing result, and providing to the outer decoding a result obtained by subtracting an output of the outer decoding from the first summing result; and
  means for summing a first input and the systematic LLRs to obtain a second summing result and providing the second summing result to the first decoding process, wherein the first input includes the output of the outer decoding.

56. The apparatus of claim 55, wherein said means for performing inner decoding includes one of means for performing convolutional decoding and means for performing LDPC decoding, and said means for performing outer decoding includes one of means for performing BCH decoding and means for performing Hamming decoding.

57. The apparatus of claim 55, wherein said communication link includes means for data storage.

58. A computer program product, comprising:
a non-transitory computer-readable medium comprising:
  code for causing at least one data processor to receive at least systematic log likelihood ratios (LLRs);
  code for causing at least one data processor to perform outer decoding;
  code for causing the at least one data processor to perform inner decoding;
  code for causing the at least one data processor to use said inner decoding and said outer decoding in combination to decode data signals received via a communication link,
  wherein said inner decoding is based on outer decoding information produced by said outer decoding;
  code for causing the at least one data processor to sum first extrinsic LLRs from a first maximum from a first decoding process in the inner decoding and deinterleaved second extrinsic LLRs from a second decoding process in the inner decoding to obtain a first summing result, and providing to the outer decoding a result obtained by subtracting an output of the outer decoding from the first summing result; and
  code for causing the at least one data processor to sum a first input and the systematic LLRs to obtain a second summing result and providing the second summing result to the first decoding process, wherein the first input includes the output of the outer decoding.

59. The computer program product of claim 58, wherein said inner decoding includes one of convolutional decoding and LDPC decoding, and said outer decoding includes one of BCH decoding and Hamming decoding.

60. The computer program product of claim 58, wherein said communication link includes a data storage system.

* * * * *